(12) United States Patent
Tomizawa et al.

(10) Patent No.: US 10,718,053 B2
(45) Date of Patent: Jul. 21, 2020

(54) WAFER LOADING APPARATUS AND FILM FORMING APPARATUS

(71) Applicant: Samsung Electronics Co., Ltd., Suwon-si, Gyeonggi-do (KR)

(72) Inventors: Kazuyuki Tomizawa, Yokohama (JP); Masashi Kikuchi, Yokohama (JP); Michio Ishikawa, Yokohama (JP); Naoki Takahashi, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 339 days.

(21) Appl. No.: 15/846,785

(22) Filed: Dec. 19, 2017

(65) Prior Publication Data

US 2019/0177847 A1 Jun. 13, 2019

(30) Foreign Application Priority Data

Dec. 7, 2017 (KR) ........................ 10-2017-0167218

(51) Int. Cl.
| | |
|---|---|
| *C23C 16/46* | (2006.01) |
| *H01L 21/687* | (2006.01) |
| *H01L 21/67* | (2006.01) |
| *H01L 21/683* | (2006.01) |

(52) U.S. Cl.
CPC ........ *C23C 16/46* (2013.01); *H01L 21/67103* (2013.01); *H01L 21/67248* (2013.01); *H01L 21/6831* (2013.01); *H01L 21/68785* (2013.01); *H01L 21/68792* (2013.01)

(58) Field of Classification Search
CPC ............... C23C 16/46; H01L 21/67103; H01L 21/67248; H01L 21/6831; H01L 21/68785; H01L 21/68792

USPC ....................................................... 219/444.1
See application file for complete search history.

(56) References Cited

U.S. PATENT DOCUMENTS

| | | | |
|---|---|---|---|
| 5,294,778 A * | 3/1994 | Carman ............ | H01L 21/67103 118/725 |
| 5,886,864 A | 3/1999 | Dvorsky | |
| 7,364,624 B2 | 4/2008 | Mariner et al. | |
| 7,417,206 B2 | 8/2008 | Nakamura | |

(Continued)

FOREIGN PATENT DOCUMENTS

| | | |
|---|---|---|
| JP | 2004-031630 A | 1/2004 |
| JP | 2004-087446 A | 3/2004 |

(Continued)

*Primary Examiner* — Jeremy Carroll
(74) *Attorney, Agent, or Firm* — Sughrue Mion, PLLC (57) ABSTRACT

A wafer loading apparatus capable of making a temperature distribution in a surface of a wafer more uniform is provided. The wafer loading apparatus includes a stage on which a wafer is loaded, and a heater installed in the stage to heat a wafer loaded on a loading surface of the stage. The stage includes a top plate providing the loading surface. The heater includes first heater coils disposed on a surface of the top plate opposite to the loading surface, electrode portions electrically connected to the first heater coils and arranged side by side along an outer peripheral portion of the top plate, and a second heater coil disposed outside the first heater coils. The second heater coil generates heat in such a way that a heat distribution in a circumferential direction is varied corresponding to the arrangement of the electrode portions.

8 Claims, 7 Drawing Sheets

(56) References Cited

U.S. PATENT DOCUMENTS

| | | | |
|---|---|---|---|
| 8,168,050 B2 | 5/2012 | Lu | |
| 8,405,005 B2 | 3/2013 | Zucker et al. | |
| 8,585,823 B2 | 11/2013 | Um | |
| 9,312,154 B2 | 4/2016 | Tran et al. | |
| 2004/0149718 A1* | 8/2004 | Ito | H01L 21/67103 219/444.1 |
| 2007/0258186 A1* | 11/2007 | Matyushkin | H01L 21/67109 361/234 |
| 2008/0017104 A1* | 1/2008 | Matyushkin | H01L 21/67109 118/696 |
| 2012/0318785 A1 | 12/2012 | Kushihashi et al. | |
| 2013/0224675 A1* | 8/2013 | Park | F27D 5/00 432/253 |

FOREIGN PATENT DOCUMENTS

| | | |
|---|---|---|
| JP | 2004-152913 A | 5/2004 |
| JP | 2005-347559 A | 12/2005 |
| JP | 2006-517740 A | 7/2006 |
| JP | 2008-060245 A | 3/2008 |
| JP | 2010-228965 A | 10/2010 |
| JP | 2011-233929 A | 11/2011 |
| JP | 2012-117141 A | 6/2012 |
| JP | 2012-525005 A | 10/2012 |
| JP | 2013-004247 A | 1/2013 |
| KR | 10-0824224 B1 | 4/2008 |
| KR | 10-1522673 B1 | 10/2014 |

* cited by examiner

WAFER LOADING APPARATUS AND FILM FORMING APPARATUS

CROSS REFERENCE TO RELATED APPLICATION

This application claims priority from Korean Patent Application No. 10-2017-0167218 filed on Dec. 7, 2017, the content of which is hereby incorporated herein as if set forth in its entirety.

BACKGROUND

Embodiments of the inventive concepts relate to a wafer loading apparatus including a heater and a film forming apparatus.

For example, an apparatus of forming a film on a semiconductor wafer (hereinafter, referred to as 'a wafer') may form a thin film on a surface of the wafer by a chemical vapor deposition (CVD) method or an epitaxial growth method. The film forming apparatus has a wafer loading apparatus (susceptor) disposed in a chamber (thin forming chamber) which can be depressurized. The wafer loading apparatus includes a stage on which the wafer is loaded, and a heater which heats the wafer loaded on a loading surface of the stage. The stage and the heater may be integrally formed with each other as a single unitary body.

In the wafer loading apparatus, a plurality of heater coils (heating resistor) may be arranged concentrically or spirally in a diameter direction of the stage on a back side of the stage to uniformly heat the wafer. However, in a conventional wafer loading apparatus, heat may be radiated from an outer peripheral portion (side surface) of the stage, and thus a temperature of an outer peripheral portion of the wafer may be lower than that of an inner portion (central portion) of the wafer. In other words, a temperature distribution in the wafer may not be uniform.

Thus, a heater coil may be added to an outer peripheral portion of a stage, and the outer peripheral portion of the stage may be heated by the added heater coil to make the temperature distribution of a wafer uniform (see Japanese Patent Publication No. 2008-060245).

SUMMARY

Embodiments of the inventive concepts may provide a wafer loading apparatus capable of making a temperature distribution in a surface of a wafer more uniform and a film forming apparatus including the wafer loading apparatus.

In an aspect, a wafer loading apparatus may include a stage on which a wafer is loaded, and a heater installed in the stage to heat the wafer loaded on a loading surface of the stage. The stage may include a top plate providing the loading surface. The heater may include a plurality of first heater coils disposed on a surface of the top plate opposite to the loading surface, a plurality of electrode portions electrically connected to the plurality of first heater coils and arranged side by side along an outer peripheral portion of the top plate, and a second heater coil disposed outside the first heater coils. The second heater coil may generate heat in such a way that a heat distribution in a circumferential direction is varied corresponding to the arrangement of the plurality of electrode portions.

In some embodiments, the plurality of first heater coils may generate heat by power supplied through the plurality of electrode portions in such a way that a heat distribution in the loading surface is substantially uniform. The second heater coil may generate the heat in such a way that the amount of heat generated from a portion of the second heater coil corresponding to a position of each of the electrode portions is greater than the amount of heat generated from a portion of the second heater coil corresponding to a region between the electrode portions.

In some embodiments, the second heater coil may be a line-shaped heating resistor disposed along the circumferential direction, and a cross-sectional area of the portion of the second heater coil corresponding to the position of each of the electrode portions may be smaller than a cross-sectional area of the portion of the second heater coil corresponding to the region between the electrode portions.

In some embodiments, the stage may further include a side skirt extending downward from the outer peripheral portion of the top plate. The second heater coil may be disposed on an inner circumferential surface of the side skirt.

In some embodiments, the outer peripheral portion of the top plate or the side skirt may have an opening or notch disposed at a position corresponding to a region between the electrode portions.

In some embodiments, the first heater coils may be arranged side by side in a diameter direction of the top plate to constitute a concentric or spiral heating resistor. Distances between the first heater coils may sequentially decrease from an inner portion of the top plate toward the outer peripheral portion of the top plate, or cross-sectional areas of the first heater coils may sequentially decrease from the inner portion of the top plate toward the outer peripheral portion of the top plate.

In some embodiments, the heater may heat the wafer loaded on the loading surface of the stage to a temperature of 600° C. to 2000° C.

In an aspect, a film forming apparatus may be an apparatus of forming a film on a wafer and may include the wafer loading apparatus.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

In the drawings, lengths, widths and sizes of components or elements are exaggerated for clarity. Accordingly, variations from the shapes of the illustrations are to be expected. Thus, exemplary embodiments should not be construed as limited to the shapes of components or elements illustrated herein but are to include deviations in shapes.

Figure 1:
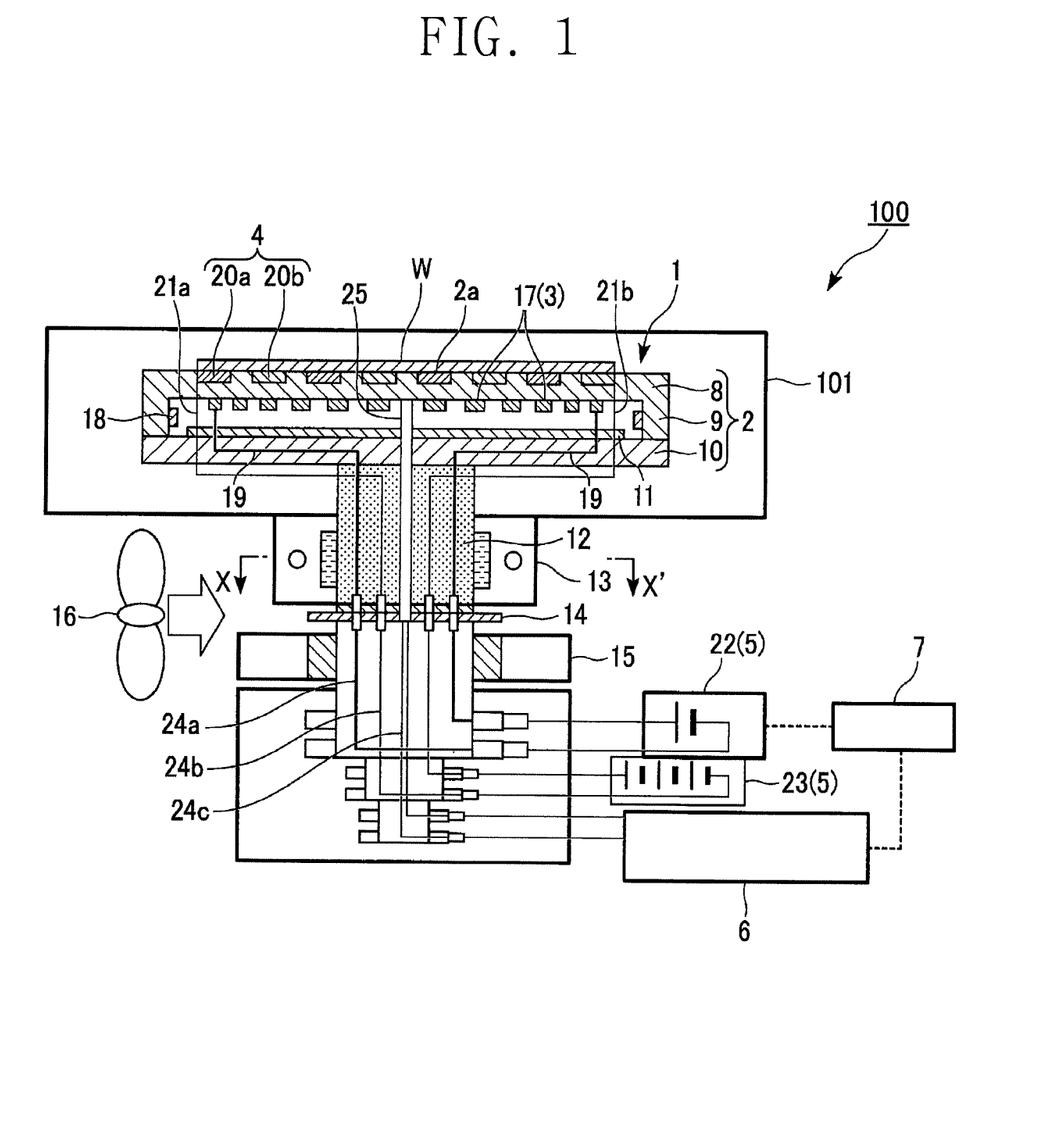
FIG. 1 is a cross-sectional view schematically illustrating a film forming apparatus including a wafer loading apparatus according to some embodiments of the inventive concepts.
Figure 2:
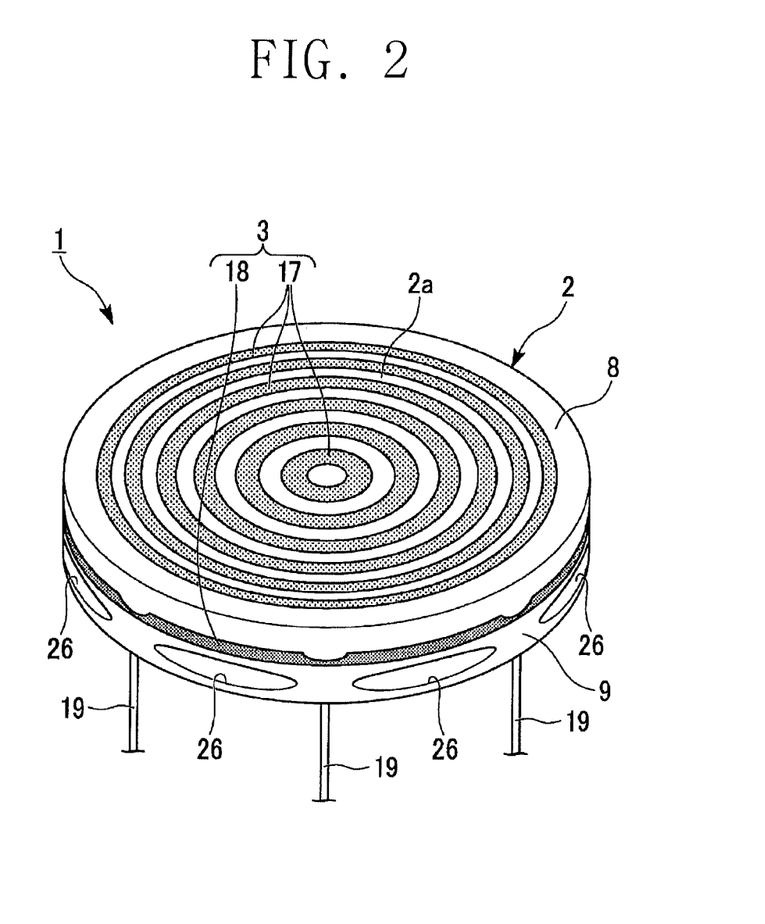
FIG. 2 is a perspective view illustrating the wafer loading apparatus of FIG. 1.
Figure 3:
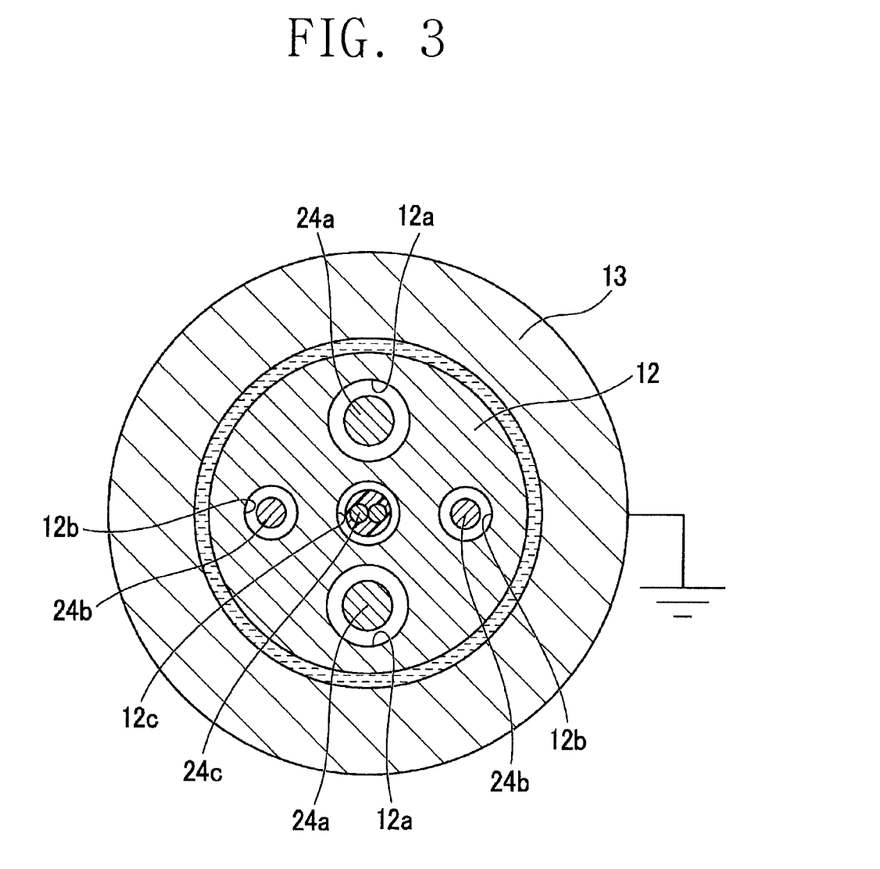
FIG. 3 is a cross-sectional view of a rotary shaft, taken along a line X-X' of FIG. 1.

A film forming apparatus 100 including a wafer loading apparatus 1 of FIGS. 1 to 3 will be described as some embodiments of the inventive concepts. FIG. 1 is a cross-sectional view schematically illustrating the film forming apparatus 100 including the wafer loading apparatus 1. FIG. 2 is a perspective view illustrating the configuration of the wafer loading apparatus 1. FIG. 3 is a cross-sectional view of a rotary shaft 12, taken along a line X-X' of FIG. 1.

The film forming apparatus 100 according to the present embodiment may form a film on a semiconductor wafer W (hereinafter, referred to as 'a wafer W') by using, for example, a chemical vapor deposition (CVD) method or an epitaxial growth method, and thus a thin film may be formed on a surface of the wafer W.

In detail, the film forming apparatus 100 may include the wafer loading apparatus 1 including a heater according to the present embodiment in a chamber (film forming chamber) 101 which can be depressurized. The wafer loading apparatus 1 may be a susceptor and may include a rotary stage 2 on which the wafer W is loaded, a heater 3 heating the wafer W loaded on a loading surface 2a of the rotary stage 2, an electrostatic chuck 4 adsorbing the wafer W loaded on the loading surface 2a of the rotary stage 2, a power supply unit 5 supplying power to the heater 3 and the electrostatic chuck 4, a temperature measurement unit 6 measuring a temperature of the wafer W loaded on the loading surface 2a of the rotary stage 2, and a power controller 7 controlling the power supplied from the power supply unit 5 to the heater 3 on the basis of the temperature measured by the temperature measurement unit 6.

The rotary stage 2 may include a disk-shaped top plate 8 providing the loading surface 2a, a cylindrical side skirt 9 extending downward from a periphery (or an edge) of the top plate 8, and a disk-shaped bottom plate 10 closing an end (a bottom surface) of the side skirt 9 opposite to the top plate 8.

The top plate 8, the side skirt 9 and the bottom plate 10 may be formed of an insulating material with excellent heat resistance and excellent corrosion resistance, such as alumina ceramics, aluminum nitride ceramics, carbon-based ceramics, or quartz. In detail, in the present embodiment, the top plate 8 and the side skirt 9 formed as a single unitary body are formed of graphite corresponding to the carbon-based ceramics, and the bottom plate 10 is formed of quartz. In addition, a disk-shaped thermal insulator 11 formed of, for example, quartz may be disposed on a surface of the bottom plate 10.

Moreover, the inventive concepts are not limited to the embodiment in which the side skirt 9 and the top plate 8 are formed as the single unitary body. In certain embodiments, the side skirt 9 and the top plate 8 may be formed separately. Furthermore, the shape of the side skirt 9 is not limited to the cylindrical shape described above. In certain embodiments, the side skirt 9 may have a tapered shape of which a diameter becomes progressively greater toward a bottom thereof.

The rotary stage 2 may include a hollow cylindrical rotary shaft 12 in which a plurality of through-holes 12a, 12b and 12c is formed. The through-holes 12a, 12b and 12c penetrate the rotary shaft 12 in an axis direction of the rotary shaft 12. The rotary shaft 12 may protrude downward from a central portion of a bottom surface of the bottom plate 10. The rotary shaft 12 may penetrate the chamber 101 and may be rotatably supported by a rotary vacuum seal 13 disposed on a bottom surface of the chamber 101. A magnetic fluid seal may be used as the rotary vacuum seal 13. In addition, the rotary shaft 12 may be connected to a driving motor 15 with a vacuum flange 14 interposed therebetween. The vacuum flange 14 is placed on a bottom end portion of the rotary shaft 12. The vacuum flange 14 may be formed of an insulating material such as ceramics. Thus, the rotary stage 2 can be rotated in a circumferential direction by the rotary shaft 12 rotated by the driving motor 15 when a film is formed.

The wafer W loaded on the loading surface 2a of the rotary stage 2 may be heated to a temperature of 600° C. to 2000° C. by the heater 3 when the film is formed. The rotary shaft 12 may be formed of an insulating material with excellent heat resistance and excellent corrosion resistance, e.g., ceramics or glass, and thus the rotary shaft 12 may withstand these high temperatures and may not be corroded by a reactive gas such as H2, HCl, or Cl2. In detail, the glass may include, for example, quartz ($SiO_2$) glass or sapphire ($Al_2O_3$) glass. On the other hand, the ceramics may include, for example, oxide-based ceramics (e.g., alumina ($Al_2O_3$) or zirconium oxide ($ZrO_2$)) or non-oxide ceramics (e.g., aluminum nitride (AlN), silicon nitride ($Si_3N_4$), silicon carbide (SiC), boron nitride (BN), or carbon-based ceramics).

The rotary shaft 12 may be formed mainly of quartz or silicon nitride. In the present embodiment, the rotary shaft 12 is formed of silicon nitride.

In addition, a cooling unit 16 for cooling the rotary shaft 12 may be installed outside the chamber 101. The cooling unit 16 may be a cooling fan that is disposed under the chamber 101 to blow air toward the rotary shaft 12 when the film is formed. However, the cooling unit 16 is not limited to an air cooling unit such as the cooling fan described above. In certain embodiments, the cooling unit 16 may be a water cooling unit. Alternatively, the cooling unit 16 may be another cooling unit using a piezoelectric element or a Peltier element.

The heater 3 may include a plurality of first heater coils 17 disposed on a surface (bottom surface) of the top plate 8 opposite to the loading surface 2a, a second heater coil 18 disposed on an inner circumferential surface of the side skirt 9, and a plurality of electrode portions 19 arranged along the inner circumferential surface of the side skirt 9 in parallel to each other.

The plurality of first heater coils 17 may be a concentric or spiral heating resistor and may be arranged side by side in a diameter direction of the top plate 8 at predetermined intervals. The second heater coil 18 may be a line-shaped heating resistor and may have a ring shape extending along a circumferential direction of the side skirt 9. The heating resistor forming the first heater coils 17 and the second heater coil 18 may be a conductive member with excellent heat resistance, such as a carbon (C) material (e.g., a thin film of boron nitride (PBN) formed by a CVD method or a thin film of pyrolytic graphite (PG)). In addition, the heating resistor may be formed of a carbon (C) material having a low volume resistivity of 4.8 $\mu\Omega m$ to 11 $\mu\Omega m$.

The plurality of electrode portions 19 may be electrically connected to the plurality of first heater coils 17 and may be arranged side by side in the circumferential direction of the side skirt 9 at predetermined intervals. In addition, each of the electrode portions 19 may extend to the rotary shaft 12.

When the film is formed, power may be supplied to the plurality of first heater coils 17 and the second heater coil 18 through the plurality of electrode portions 19. Thus, the heater coils 17 and 18 may emit heat to heat the wafer W loaded on the loading surface 2a.

The electrostatic chuck 4 may include a pair of inner electrodes 20a and 20b embedded in a dielectric layer provided at a surface (loading surface 2a) of the top plate 8, and a pair of electrode portions 21a and 21b electrically connected to the pair of inner electrodes 20a and 20b and extending to the rotary shaft 12.

When the film is formed, a voltage may be applied between the pair of inner electrodes 20a and 20b through the pair of electrode portions 21a and 21b. As a result, an inverse voltage may be induced at a surface of the wafer W, and thus the electrostatic chuck 4 may adsorb the wafer W by Coulomb force, Johnsen-Rahbek force or gradient force formed therebetween.

The power supply unit 5 may include a heater power source 22 for supplying the power to the heater 3, and an electrostatic chuck power source 23 for supplying the power to the electrostatic chuck 4. The heater power source 22 may be electrically connected to the heater 3 (in detail, the plurality of electrode portions 19) through a plurality of first interconnection lines 24a extending outside the chamber 101 through the through-holes 12a of the rotary shaft 12. The electrostatic chuck power source 23 may be electrically connected to the electrostatic chuck 4 (in detail, the pair of electrode portions 21a and 21b) through a pair of second interconnection lines 24b extending outside the chamber 101 through the through-holes 12b of the rotary shaft 12.

The temperature measurement unit 6 may include a thermocouple 25 that is electrically connected to a pair of third interconnection lines 24c extending outside the chamber 101 through the through-hole 12c of the rotary shaft 12. The thermocouple 25 may extend to the top plate 8 through the through-hole 12c of the rotary shaft 12 and may be installed to be in contact with the top plate 8. The temperature measurement unit 6 may measure a temperature (weak signal) of the wafer W loaded on the loading surface 2a by the thermocouple 25 and may provide the measured result to the power controller 7.

The power controller 7 may control the power supplied from the heater power source 22 to the heater 3 on the basis of the temperature measured by the temperature measurement unit 6 in such a way that the wafer W is heated to a desired temperature.

However, in the wafer loading apparatus 1 according to the present embodiment, distances (or intervals) between the first heater coils 17 may sequentially decrease from an inner portion (central portion) of the top plate 8 toward the outer peripheral portion of the top plate 8, or cross-sectional areas of the first heater coils 17 may be sequentially decrease from the inner portion (central portion) of the top plate 8 toward the outer peripheral portion of the top plate 8. Thus, the first heater coils 17 may heat the loading surface 2a in such a way that a heat distribution is substantially uniform in the loading surface 2a.

Meanwhile, a cross-sectional area (e.g., a width or a thickness) of a portion of the second heater coil 18 corresponding to a position of each of the electrode portions 19 may be smaller than that of a portion of the second heater coil 18 corresponding to a region between the electrode portions 19. In the present embodiment, a thickness of the second heater coil 18 may be constant, and the width of the portion of the second heater coil 18 corresponding to the position of each of the electrode portions 19 may be smaller than the width of the portion of the second heater coil 18 corresponding to the region between the electrode portions 19. Thus, the amount of heat generated from the portion of the second heater coil 18 corresponding to the position of each of the electrode portions 19 may be greater than the amount of heat generated from the portion of the second heater coil 18 corresponding to the region between the electrode portions 19.

As described above, in the wafer loading apparatus 1 of the present embodiment, the second heater coil 18 may be disposed in such a way that a heat distribution in the circumferential direction of the side skirt 9 is varied corresponding to the arrangement of the electrode portions 19.

In this case, the second heater coil 18 may generate heat in such a way that the amount of the heat generated from the portion corresponding to the position of each of the electrode portions 19 is greater than the amount of the heat generated from the portion corresponding to the region between the electrode portions 19. Thus, the amount of the heat generated from the second heater coil 18 may supplement the amount of heat radiated from an outer peripheral portion (side surface) of the rotary stage 2 and the amount of heat radiated through the electrode portions 19, thereby increasing the uniformity of the heat distribution in the loading surface 2a.

As a result, the wafer loading apparatus 1 according to the present embodiment may prevent a problem that a temperature of an outer peripheral portion of the wafer W is lower than a temperature of an inner portion (or central portion) of the wafer W, and thus a temperature distribution in a surface of the wafer W loaded on the loading surface 2a may be more uniform.

In addition, in the wafer loading apparatus 1 of the present embodiment, a plurality of openings or notches 26 (in the present embodiment, the openings) may be formed in the side skirt 9 in addition to the above components to make the heat distribution in the loading surface 2a more uniform. The openings 26 may be provided at positions corresponding to the regions between the electrode portions 19.

As a result, the amount of heat radiated from each of the positions at which the openings 26 are formed may be less than the amount of heat radiated from a region between the openings 26. Thus, the openings 26 may control or adjust the heat distribution in the loading surface 2a along with the second heater coil 18 to increase the uniformity of the heat distribution.

As a result, in the wafer loading apparatus 1 of the present embodiment, the temperature distribution in the surface of the wafer W may be more uniform by forming the plurality of openings (or notches) 26 in the side skirt 9.

However, embodiments of the inventive concepts are not limited to the above embodiment. In certain embodiments, the wafer loading apparatus 1 may be variously modified without departing from the spirits and scopes of the inventive concepts.

Figure 4:
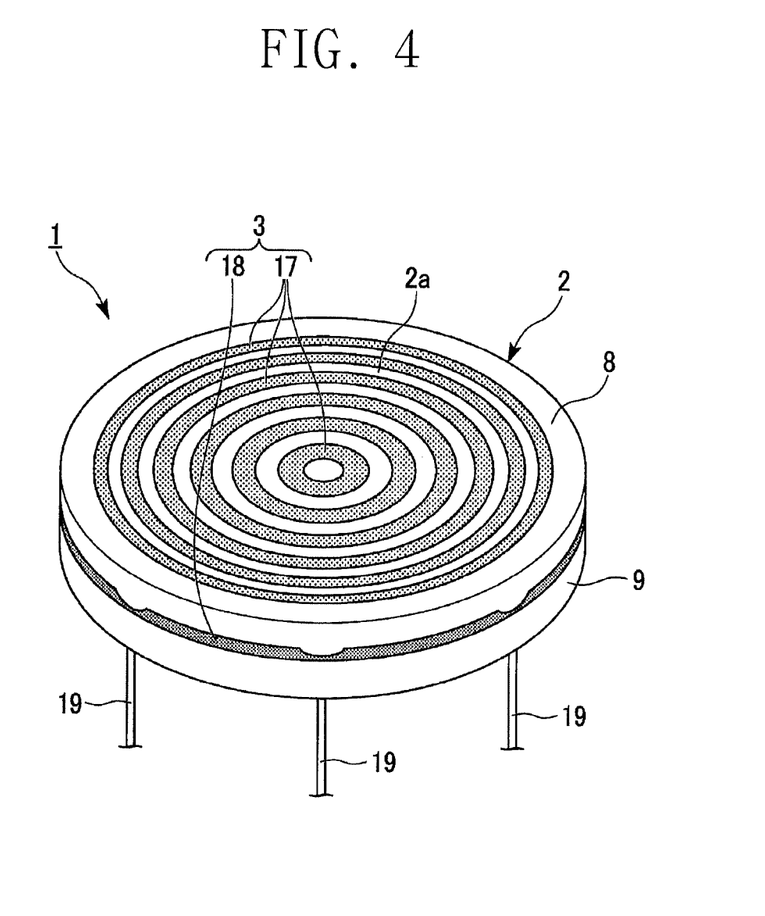
FIG. 4 is a perspective view illustrating a wafer loading apparatus according to some embodiments of the inventive concepts.

For example, the openings (or notches) 26 may be omitted in the wafer loading apparatus 1, as illustrated in FIG. 4.

Figure 5:
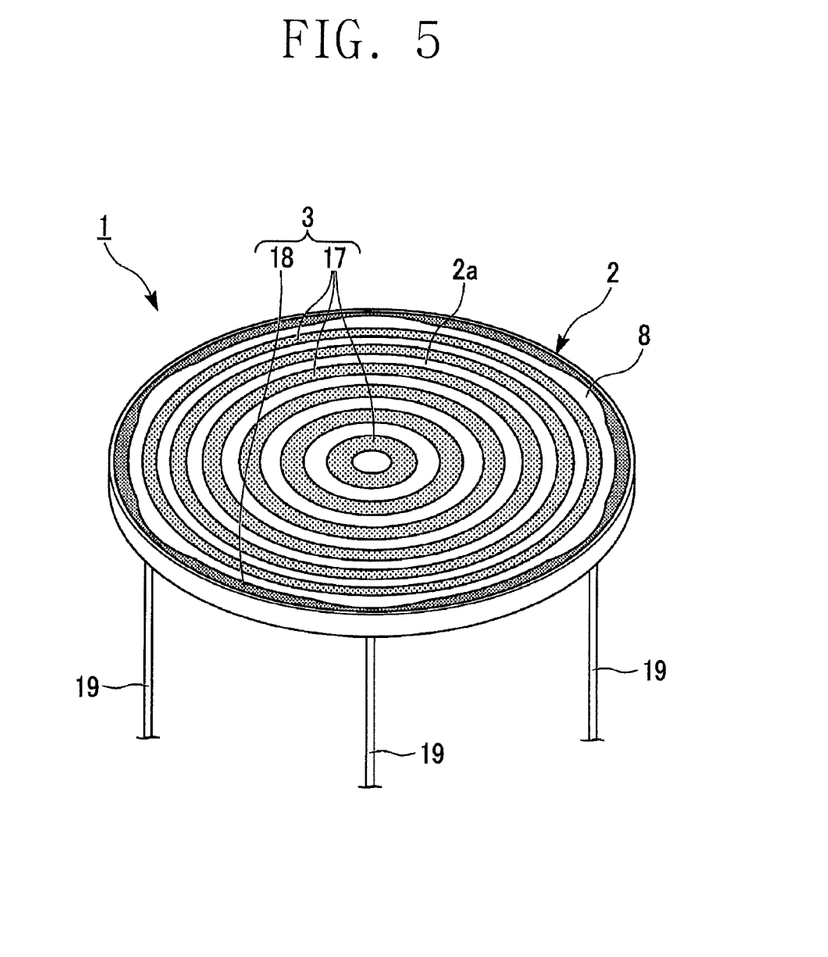
FIG. 5 is a perspective view illustrating a wafer loading apparatus according to some embodiments of the inventive concepts.

In certain embodiments, the side skirt 9 forming the rotary stage 2 may be omitted in the wafer loading apparatus 1, as illustrated in FIG. 5. In this case, the second heater coil 18 may be disposed outside the first heater coils 17 disposed on the bottom surface of the top plate 8.

Even in this case, the second heater coil 18 may generate heat in such a way that the amount of heat generated from a portion of the second heater coil 18 corresponding to the position of each of the electrode portions 19 is greater than the amount of heat generated from a portion of the second heater coil 18 corresponding to the region between the electrode portions 19. Thus, the amount of the heat generated from the second heater coil 18 may supplement the amount of heat radiated from an outer peripheral portion of the rotary stage 2 and the amount of heat radiated through the electrode portions 19, thereby increasing the uniformity of the heat distribution in the loading surface 2a.

EMBODIMENTS

Hereinafter, the effects of the inventive concepts will become more apparent through the following embodiments. However, the inventive concepts are not limited to the following embodiments and may be variously modified.

First Embodiment

The wafer loading apparatus 1 of the aforementioned embodiment and a wafer loading apparatus of a comparative example are provided. The openings 26 of the wafer loading apparatus 1 of the above embodiment are omitted in the wafer loading apparatus of the comparative example. In addition, the wafer loading apparatus of the comparative example includes a second heater coil having a constant cross-sectional area (width and thickness) along the circumferential direction of the side skirt 9, instead of the second heater coil 18.

Figure 6:
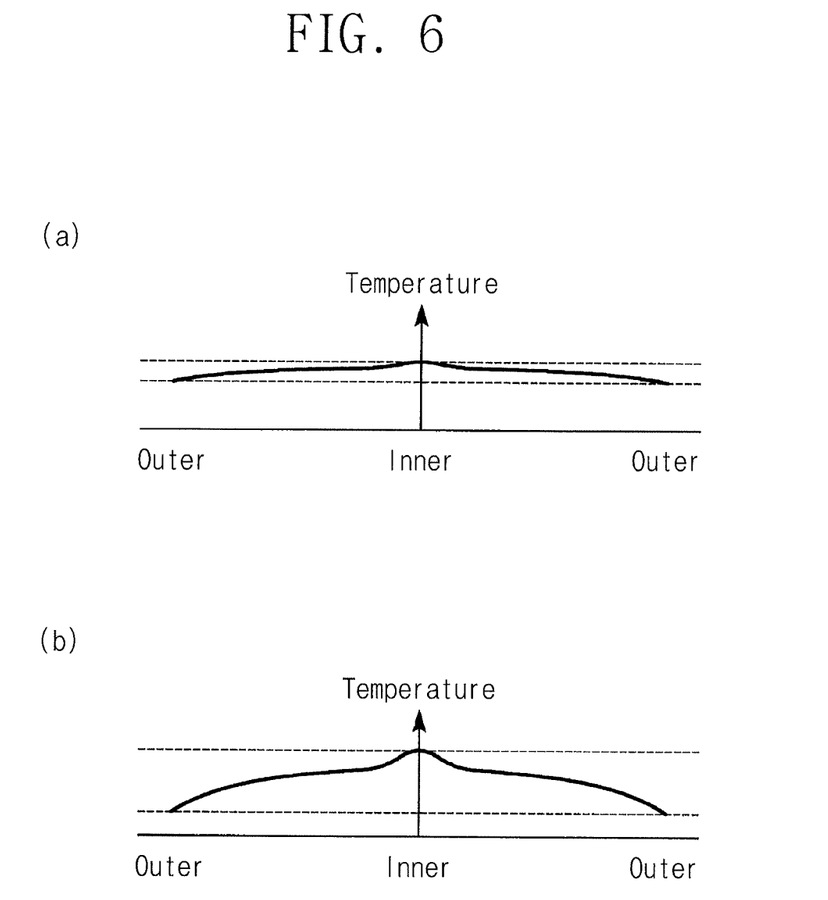
FIG. 6 is a graph showing the results of measurement of a temperature distribution in a surface of a wafer in a wafer loading apparatus, according to a first embodiment.

By using each of the wafer loading apparatus 1 of the above embodiment and the wafer loading apparatus of the comparative example, a temperature distribution (in-plane temperature distribution) in a surface of a wafer loaded on the loading surface was measured through simulation while heating the stage by the heater. The measured results are shown in a graph (a) and a graph (b) of FIG. 6. The graph (a) of FIG. 6 shows the measured results of the in-plane temperature distribution of the wafer on the wafer loading apparatus 1 of the embodiment. The graph (b) of FIG. 6 shows the measured results of the in-plane temperature distribution of the wafer on the wafer loading apparatus of the comparative example.

As shown in the graphs (a) and (b) of FIG. 6, a difference in temperature between an inner portion and an outer peripheral portion of the wafer heated by the wafer loading apparatus 1 of the embodiment is smaller than that of the wafer heated by the wafer loading apparatus of the comparative example, and the in-plane temperature distribution of the wafer heated by the wafer loading apparatus 1 of the embodiment is more uniform than that of the wafer heated by the wafer loading apparatus of the comparative example.

Second Embodiment

Figure 7:
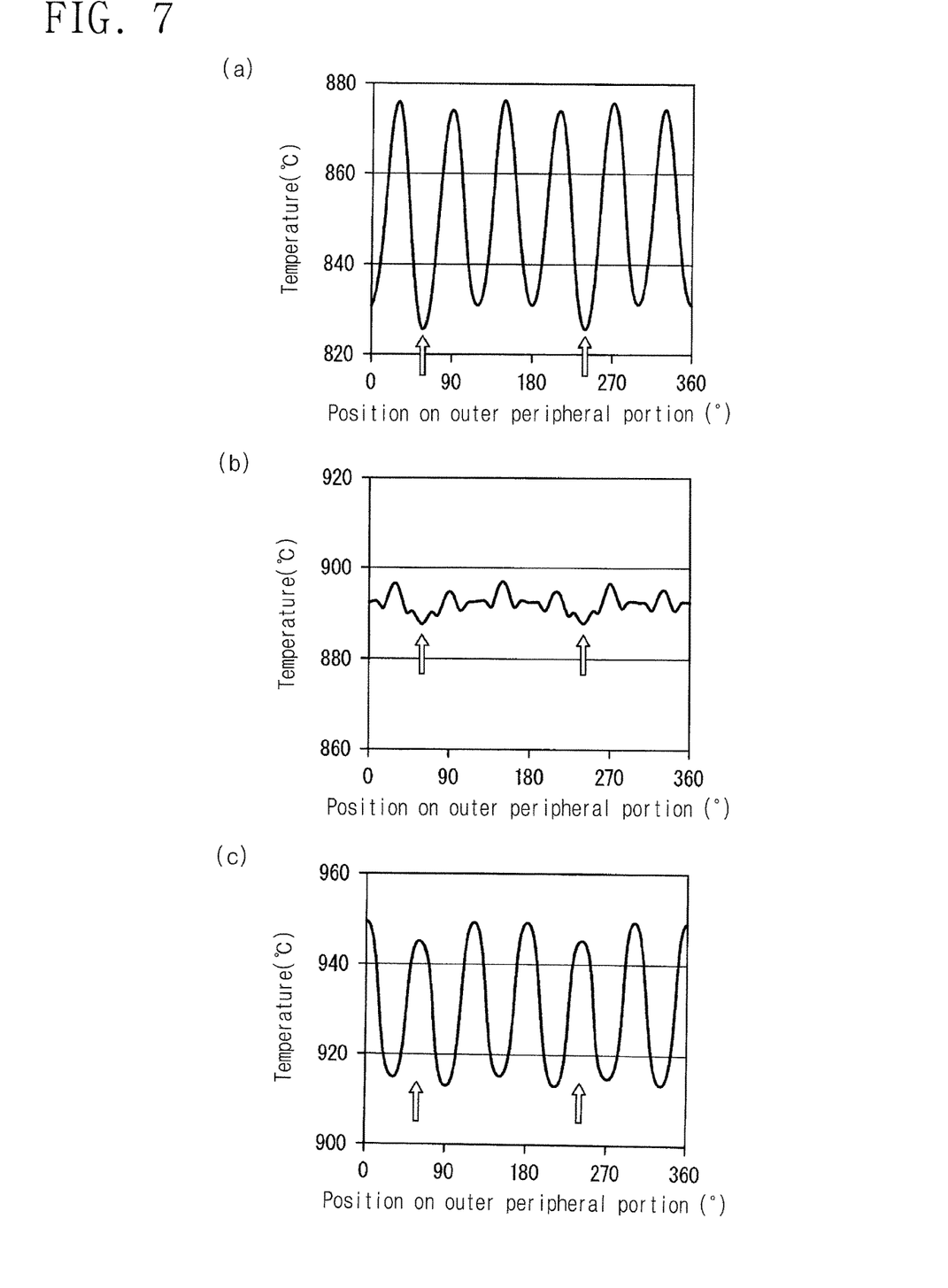
FIG. 7 is a graph showing the results of measurement of a temperature distribution in an outer peripheral portion of a wafer in a wafer loading apparatus, according to a second embodiment.

By suing each of the wafer loading apparatus 1 of the above embodiment and the wafer loading apparatus of the comparative example, a temperature distribution (outer peripheral temperature distribution) at an outer peripheral portion of a wafer loaded on the loading surface was measured through simulation while heating the stage by the heater. The measured results are shown in a graph (a) and a graph (b) of FIG. 7. The graph (a) of FIG. 7 shows the measured results of the outer peripheral temperature distribution of the wafer on the wafer loading apparatus of the comparative example. The graph (b) of FIG. 7 shows the measured results of the outer peripheral temperature distribution of the wafer on the wafer loading apparatus 1 of the embodiment.

As shown in the graphs (a) and (b) of FIG. 7, a temperature difference in a circumferential direction at the outer peripheral portion of the wafer heated by the wafer loading apparatus 1 of the embodiment is smaller than that of the wafer heated by the wafer loading apparatus of the comparative example, and the outer peripheral temperature distribution of the wafer heated by the wafer loading apparatus 1 of the embodiment is more uniform than that of the wafer heated by the wafer loading apparatus of the comparative example.

In addition, a wafer loading apparatus in which a ratio of the maximum width to the minimum width of the second heater coil is 3:1 was prepared as a reference example. By using the wafer loading apparatus of the reference example, an outer peripheral temperature distribution of a wafer loaded on the loading surface was measured through simulation while heating the stage by the heater. The measured results are shown in a graph (c) of FIG. 7.

In addition, a ratio of the maximum width to the minimum width of the second heater coil is 2:1 in the wafer loading apparatus 1 of the embodiment. On the other hand, a ratio of the maximum width to the minimum width of the second heater coil is 1:1 in the wafer loading apparatus of the comparative example.

As shown in the graph (c) of FIG. 7, a temperature difference in the circumferential direction at the outer peripheral portion of the wafer heated by the wafer loading apparatus of the reference example is great, and positions of a high-temperature portion and a low-temperature portion of the graph (c) of FIG. 7 are reversed to those of high-temperature portions and low-temperature portions of the graphs (a) and (b) of FIG. 7.

Thus, the outer peripheral temperature distribution of the wafer can be adjusted by changing the ratio of the maximum width to the minimum width of the second heater coil (or a ratio of the cross-sectional areas of the second heater coil). In addition, the uniformity of the in-plane temperature distribution and the outer peripheral temperature distribution of the wafer can be sufficiently improved by this adjustment.

Some embodiments of the inventive concepts may provide the wafer loading apparatus capable of making the temperature distribution in the surface of the wafer more uniform, and the film forming apparatus including the wafer loading apparatus.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A wafer loading apparatus comprising:
   a stage on which a wafer is loaded; and
   a heater installed in the stage to heat the wafer loaded on a loading surface of the stage,
   wherein the stage comprises a top plate providing the loading surface,
   wherein the heater comprises:
     a plurality of first heater coils disposed on a surface of the top plate opposite to the loading surface;
     a plurality of electrode portions electrically connected to the plurality of first heater coils and arranged side by side along an outer peripheral portion of the top plate; and
     a second heater coil disposed outside the first heater coils, and wherein the second heater coil generates heat in such a way that a heat distribution in a circumferential direction is varied corresponding to an arrangement of the plurality of electrode portions.

2. The wafer loading apparatus of claim 1, wherein the plurality of first heater coils generates heat by power supplied through the plurality of electrode portions in such a way that a heat distribution in the loading surface is substantially uniform, and wherein the second heater coil generates the heat in such a way that an amount of heat generated from a first portion of the second heater coil corresponding to a position of each of the electrode portions is greater than an amount of heat generated from a second portion of the second heater coil corresponding to a region between the electrode portions.

3. The wafer loading apparatus of claim 2, wherein the second heater coil is a line-shaped heating resistor disposed along the circumferential direction, and wherein a cross-sectional area of the first portion of the second heater coil corresponding to the position of each of the electrode portions is smaller than a cross-sectional area of the second portion of the second heater coil corresponding to the region between the electrode portions.

4. The wafer loading apparatus of claim 1, wherein the stage further comprises a side skirt extending downward from the outer peripheral portion of the top plate, and wherein the second heater coil is disposed on an inner circumferential surface of the side skirt.

5. The wafer loading apparatus of claim 4, wherein the outer peripheral portion of the top plate or the side skirt has an opening or notch disposed at a position corresponding to a region between the electrode portions.

6. wafer loading apparatus of claim 1, wherein the first heater coils are arranged side by side in a diameter direction of the top plate to constitute a concentric or spiral heating resistor, and wherein distances between the first heater coils sequentially decrease from an inner portion of the top plate toward the outer peripheral portion of the top plate, or cross-sectional areas of the first heater coils sequentially decrease from the inner portion of the top plate toward the outer peripheral portion of the top plate.

7. The wafer loading apparatus of claim 1, wherein the heater heats the wafer loaded on the loading surface of the stage to a temperature of 600° C. to 2000° C.

8. A film forming apparatus comprising:
a chamber;
a wafer loading apparatus provided in the chamber, the wafer loading apparatus comprising:
   a stage on which a wafer is loaded; and
   a heater installed in the stage to heat the wafer loaded on a loading surface of the stage,
wherein the stage comprises a top plate providing the loading surface,
wherein the heater comprises:
   a plurality of first heater coils disposed on a surface of the top plate opposite to the loading surface;
   a plurality of electrode portions electrically connected to the plurality of first heater coils and arranged side by side along an outer peripheral portion of the top plate; and
   a second heater coil disposed outside the first heater coils, and
wherein the second heater coil generates heat in such a way that a heat distribution in a circumferential direction is varied corresponding to an arrangement of the plurality of electrode portions.

* * * * *